(12) United States Patent
Demolli et al.

(10) Patent No.: US 7,777,537 B2
(45) Date of Patent: Aug. 17, 2010

(54) METHOD FOR PROVIDING A POWER ON RESET SIGNAL WITH A LOGARITHMIC CURRENT COMPARED WITH A QUADRATIC CURRENT

(75) Inventors: Frederic Demolli, Rognac (FR); Thierry Soudé, Marseilles (FR); Daniel Payrard, Maximin (FR); Michel Cuenca, Septemes les vallons (FR)

(73) Assignee: Atmel Corporation, San Jose, CA (US)

(\*) Notice: Subject to any disclaimer, the term of this patent is extended or adjusted under 35 U.S.C. 154(b) by 37 days.

(21) Appl. No.: 11/598,372

(22) Filed: Nov. 13, 2006

(65) Prior Publication Data

US 2008/0115000 A1 May 15, 2008

(51) Int. Cl.
*H03L 7/00* (2006.01)
(52) U.S. Cl. ............... 327/143; 327/142; 327/198
(58) Field of Classification Search ............ 327/142, 327/143, 198
See application file for complete search history.

(56) References Cited

U.S. PATENT DOCUMENTS

| | | | |
|---|---|---|---|
| 5,144,159 A * | 9/1992 | Frisch et al. | 327/198 |
| 5,680,036 A | 10/1997 | Faulk | |
| 6,040,729 A | 3/2000 | Sanchez et al. | |
| 6,452,414 B1 | 9/2002 | Lorenz | |
| 6,894,544 B2 * | 5/2005 | Gubbins | 327/143 |
| 6,965,360 B2 | 11/2005 | DeCaro et al. | |
| 7,019,568 B2 | 3/2006 | Olsen | |
| 7,019,720 B2 | 3/2006 | LeChevalier | |
| 7,135,894 B1 * | 11/2006 | Stegers et al. | 327/108 |
| 2002/0167507 A1 | 11/2002 | DeCaro et al. | |
| 2002/0169571 A1 | 11/2002 | DeCaro et al. | |
| 2003/0151570 A1 | 8/2003 | LeChevalier et al. | |
| 2003/0227306 A1 * | 12/2003 | Di Iorio | 327/143 |
| 2005/0248404 A1 | 11/2005 | Gilbert | |
| 2008/0111592 A1 | 5/2008 | Demolli et al. | |
| 2008/0115000 A1 | 5/2008 | Demolli et al. | |

FOREIGN PATENT DOCUMENTS

| | | | |
|---|---|---|---|
| WO | WO-2008/064029 A3 | 5/2008 | |
| WO | WO-2008/064030 A3 | 5/2008 | |
| WO | WO-2008064030 A2 | 5/2008 | |

OTHER PUBLICATIONS

Spector, Lawrence. The Math Page. Aug. 23, 2003. http://web.archive.org/web/20030823063501/http://themathpage.com/aPreCalc/logarithmic-exponential-function.htm.*

(Continued)

*Primary Examiner*—Lincoln Donovan
*Assistant Examiner*—John W Poos
(74) *Attorney, Agent, or Firm*—Schwegman, Lundberg & Woessner, P.A.

(57) ABSTRACT

Aspects of the present invention include a method, apparatus and device for generating a power on reset (POR) signal in relation to the crossing point of two currents wherein at least one current is a quadratic function and the other is a logarithmic function, where each has a mathematical correlation to a function of the power supply voltage.

21 Claims, 6 Drawing Sheets

OTHER PUBLICATIONS

Dictionary.com; computing device definition; 2005; Princeton University.*

Adel Sedra, Kenneth Smith, MicroElectronic Circuits, 2004, Oxford University Press, Fifth Edition, p. 240.*

"U.S. Appl. No. 11/598,346, Response filed Jul. 10, 2008 to Non-Final Office Action mailed Mar. 10, 2008", 12 pages.

"U.S. Appl. No. 11/598,346, Non-Final Office Action mailed Mar. 10, 2008", 17 Pgs.

"U.S. Appl. No. 11/598,346, Final Office Action Mailed Oct. 2, 2008", 17 pgs.

"International Application Serial No. PCT/US2007/084597, International Search Report mailed May 9, 2008", 2 pgs.

"International Application Serial No. PCT/US2007/084597, Written Opinion mailed May 9, 2008", 5 pgs.

"International Application Serial No. PCT/US2007/084598, International Search Report mailed May 9, 2008", 2 pgs.

"International Application Serial No. PCT/US2007/084598, Written Opinion mailed May 9, 2008", 6 pgs.

"U.S. Appl. No. 11/598,346, Response filed Feb. 27, 2009 to Final Office Action mailed Oct. 2, 2008", 13 pages.

"U.S. Appl. No. 11/598,346, Notice of Allowance mailed Apr. 23, 2009", 8 pgs.

"U.S. Appl. No. 11/598,346, Notice of Allowance Mailed Dec. 4, 2009", 7 pgs.

"U.S. Appl. No. 11/598,346, Notice of Allowance mailed Aug. 13, 2009", 7 pgs.

* cited by examiner

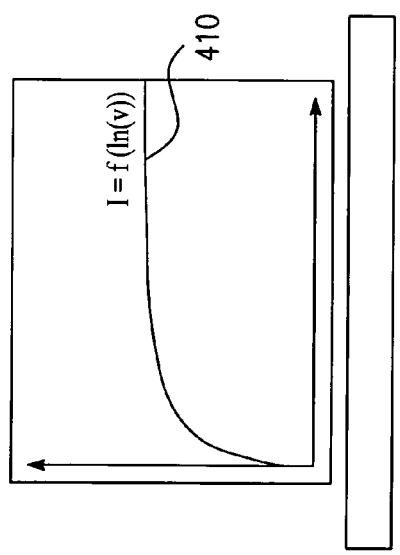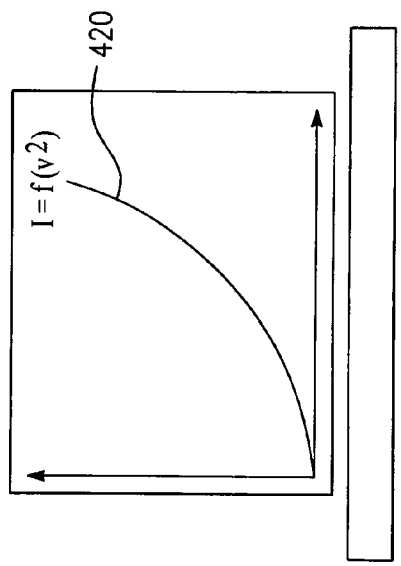
*FIG. 4A*  *FIG. 4B*

METHOD FOR PROVIDING A POWER ON RESET SIGNAL WITH A LOGARITHMIC CURRENT COMPARED WITH A QUADRATIC CURRENT

CROSS REFERENCE TO RELATED APPLICATIONS

This application is related to co-pending U.S. application Ser. No. 11/598,346 filed Nov. 13, 2006, entitled: "Method for Providing a Power on Reset Signal with a Quadratic Current Compared to an Exponential Current," which is assigned to the assignee of the present invention and also is incorporated by reference herein.

FIELD OF INVENTION

The present invention relates generally to electrical circuits and more particularly to power on reset (POR) circuits.

BACKGROUND OF THE INVENTION

It is widely known that POR circuits, typically formed on a semiconductor chip or integrated circuit (IC), initially reset the internal circuits of the chip automatically when an operating voltage is first switched on to the chip. POR circuits typically prevent invalid conditions in an electrical circuit by ensuring that the electrical circuit has sufficient power before allowing it to operate at its necessary operating conditions. In an IC, for example, a POR circuit typically may be utilized to ensure that there is a provision for adequate voltage from a power source to the chip before the chip is operationally enabled.

In operation, the POR circuit enables the chip only when the power required to adequately power the chip is known to be available from the power source and is within a predetermined or specified range. If the power requirements are inadequate or where the power to be supplied is not within the acceptable range, the typical POR circuit maintains the chip to be inoperable or operationally disabled. This disabling characteristic may be overcome in typical POR circuits once a POR circuit determines that the needed power is available, usually via a voltage "trip point" of the POR. Once a predetermined voltage is received by the POR circuit, a threshold is met and the POR circuit typically thereafter enables the operation of the chip by a signal. Conversely, a signal may also be sent based on upon a determination that there is a voltage drop below a predetermined value whereafter the chip would be disabled. As used here, the signal used to enable or disable the chip is referred to as a "power on reset signal" or "POR signal."

FIG. 1 is a schematic representation of an exemplary POR circuit 100. The POR circuit 100 is not intended to be the only representation of a POR circuit for use with or in consideration of the present invention as POR circuit 100 is exemplary of but one type of POR circuit. POR circuit 100 includes resistors 110, 120, 130, 140, and 150 (which form a resistor ladder), capacitors 160 and 170, transistors 180 and 190, a ground path at 185, and an inverter 199. POR circuit 100 is powered by a power source which may be a power supply at 115 having a voltage supply to the circuit of $V_{SUPPLY}$ and which may also be the same power supply providing power to the chip (not shown) controlled by POR circuit 100.

Operationally, the resistor ladder produces a scaled version of $V_{SUPPLY}$ that appears on node $N_V$ at 125 which controls the voltage on the gate of transistor 180. When the scaled version of $V_{SUPPLY}$ reaches the threshold voltage (i.e., predetermine threshold voltage) of transistor 180, transistor 180 will turn ON. Once operational, transistor 180 pulls the input voltage to inverter 199 via node $N_O$ at 198 to ground, resulting in a logical HIGH state output 197 (e.g., POR signal) at node $N_{OUT}$ of the inverter 199, thereby enabling the chip (not shown) controlled by the POR circuit 100.

In this arrangement, where $V_{SUPPLY}$ rises from ground to its operating level (i.e., in an OFF to ON scenario), the POR circuit 100 maintains the chip as being disabled until $V_{SUPPLY}$ achieves a value (i.e., voltage amount) sufficient to trip transistor 180 to an ON state (i.e., trip point threshold).

Conversely, the chip controlled by POR circuit 100 is disabled when $N_{OUT}$ 197 is at a logical LOW, as there is no pulling of voltage across $N_V$ at 125 to the inverter 199. Instead, when $V_{SUPPLY}$ voltage is below the trip point threshold, transistor 180 is disabled (e.g., OFF) and resistor 150 pulls the input voltage to inverter 199 to the $V_{SUPPLY}$ voltage. Inverter 199 will interpret that $V_{SUPPLY}$ voltage is at a logical HIGH, causing a logical LOW state output at 197. The logical LOW state output at 197 serves as an active LOW reset signal (e.g., POR signal), which resets the chip and maintains it as remaining disabled.

Sensitivities to noise reduction to the POR circuit 100 are attempted to be reduced by employing capacitors 160 and 170 and transistor 190. Capacitors 160 and 170 slow down the slew rate of nodes $N_V$ and $N_O$. The effect of the slow down of the slew rate requires that $V_{SUPPLY}$ achieve or exceed the trip point threshold for a predetermined period of time before the voltage on $N_O$ crosses the threshold of the inverter 199 (i.e., time counting).

Because typical ICs function over a range of power-supply voltages, the ICs may also commonly include a POR circuit that resets the IC to a known state upon application of power and holds the known state until the power supply voltages settle at or near some predetermined level. In this scenario, typically, the POR circuit is powered by the same source as the rest of the IC.

FIG. 2 is a schematic representation of an exemplary POR circuit 200 including a voltage comparator 210, a voltage divider 220 and a reference circuit 230 that provides stable reference voltages that have small variations with regard to process, supply-voltage, and temperature. An example of such a reference circuit may include a Band Gap Reference circuit, such as those discussed U.S. Pat. No. 6,489,835 to Yu et al. and U.S. Pat. No. 6,323,630 to Banba, both of which are incorporated herein by reference.

From FIG. 2, the reference circuit 230 provides a signal $V_{SIG}$ at 231 to the non-inverting input of comparator 210 at 211. The voltage divider 220 provides a reference voltage $V_{REF}$ at 221 that is a less than the supply voltage $V_{SUPP}$ at 216, to the inverting input of comparator 210 at 212. Comparator 210 compares the reference current signal $V_{SIG}$ and reference voltage $V_{REF}$ to generate a POR signal, $POR_{SIG}$, at 240.

A problem with typical POR circuits is that POR signals may be inaccurate as trip points may vary widely due to variations in the components, manufacturing or operating environment of resident devices. In part, this issue arises as a result of economical choices in components and operational activities versus highly-tolerant elections. Another issue arising with typical POR circuits is that POR circuits may be especially susceptible to process variations and are dependent on generated signals and voltage comparisons based on voltage-centric dependencies. Often POR circuits generate $POR_{SIG}$ by a simple comparison of voltage values including capacitor charge voltages via basic comparator operations, which are also susceptible to wide variations. Additionally, a further limitation of typical POR circuits is that time counting is employed and power supply sources are not monitored or evaluated.

Unfortunately, these limitations have thus proven to be unavoidable challenges in the field. As can be appreciated, reliable, economical and efficient techniques for generating accurate power on reset signals for various circuit and chip applications are highly desirable.

Accordingly, what is needed is a method and apparatus for generating precise power on reset signals by relating characteristics of typical components or circuits through a novel current architecture which permits voltage threshold monitoring that is cost effective and may be readily implemented.

SUMMARY OF THE INVENTION

The present invention fulfills these needs and has been developed in response to the present state of the art, and in particular, in response to the problems and needs in the art that have not yet been fully solved by currently available security protocols and technologies.

A method of providing a reliable power on reset (POR) signal with in accordance with a current architecture relating characteristics of typical POR attributes that also permits voltage threshold monitoring is disclosed.

A circuit capable of providing a reliable power on reset (POR) signal with in accordance with a current architecture relating characteristics of typical POR attributes that also permits voltage threshold monitoring is also disclosed.

An apparatus having a circuit capable of providing a reliable power on reset (POR) signal with in accordance with a current architecture relating characteristics of typical POR attributes that also permits voltage threshold monitoring is further disclosed.

In one embodiment, a method of providing a reliable power on reset (POR) signal using a current architecture comparing a first quadratic current with a second logarithmic current in relation to power supply voltage is presented.

In another embodiment of the present invention, a circuit providing a reliable power on reset (POR) signal (i.e., $POR_{SIG}$) using a current architecture comparing a first quadratic current with a second logarithmic current in relation to power supply voltage is presented.

In a further embodiment of the present invention, an apparatus having a circuit providing a reliable power on reset (POR) signal (i.e., $POR_{SIG}$) using a current architecture comparing a first quadratic current with a second logarithmic current in relation to power supply voltage is presented.

BRIEF DESCRIPTION OF THE DRAWING(S)

FIG. 4A depicts a graphical representation of a logarithmic current in accordance with an embodiment of the present invention.

FIG. 4B depicts a graphical representation of a quadratic current in accordance with an embodiment of the present invention.

DETAILED DESCRIPTION OF THE INVENTION

The present invention relates generally to electrical circuits and more particularly to power on reset (POR) circuits. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
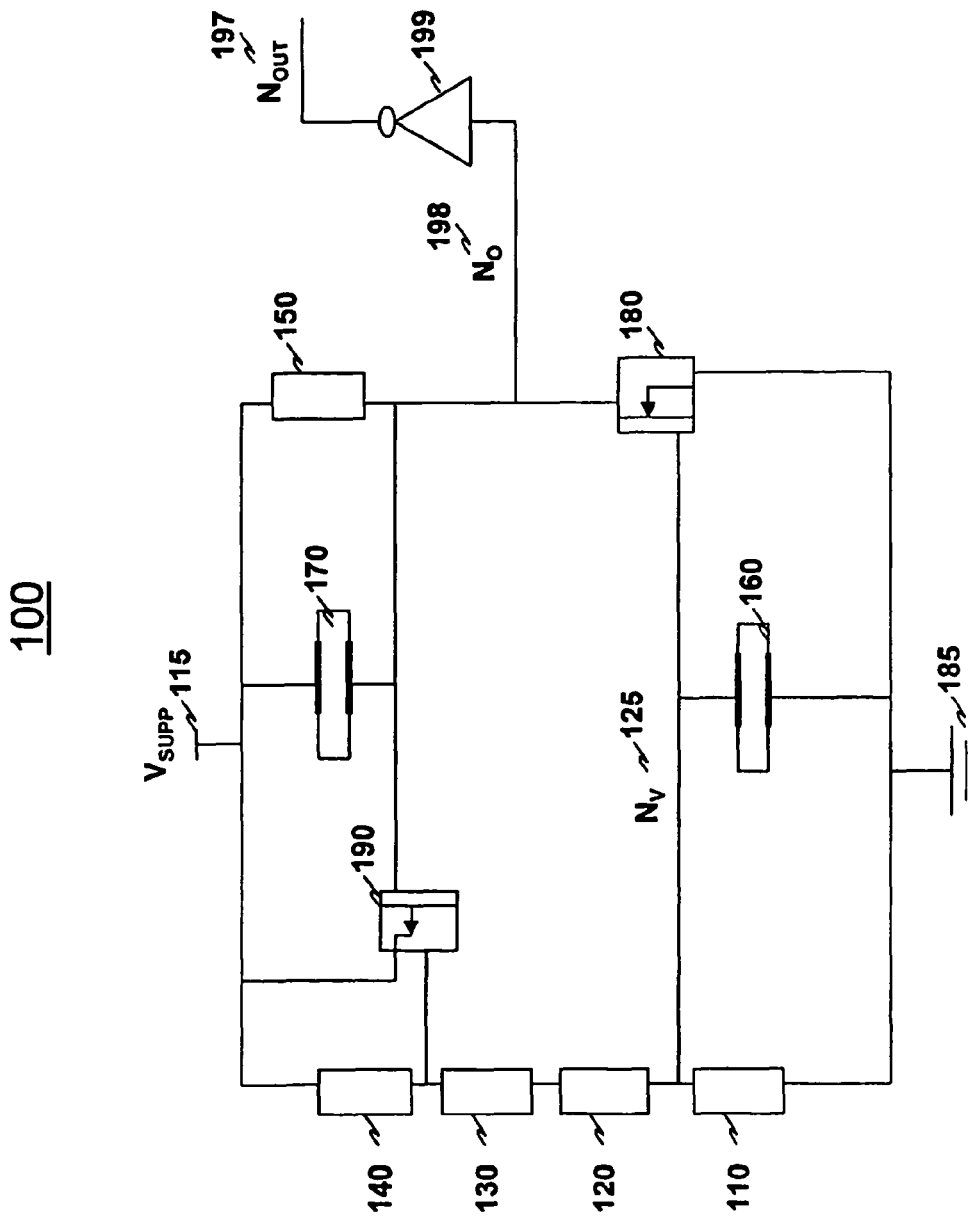
FIG. 1 is a schematic representation of an exemplary POR circuit.
Figure 2:
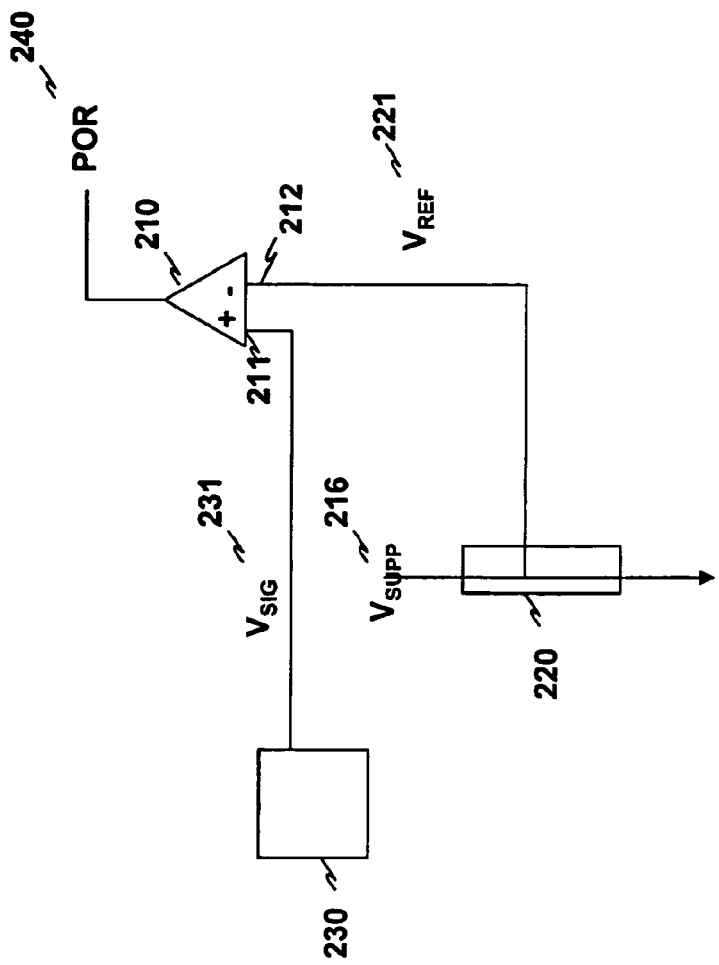
FIG. 2 is a schematic representation of an exemplary POR circuit including a voltage comparator, a voltage divider and a reference circuit that provides stable reference voltages that have small variations with regard to process, supply-voltage, and temperature.
Figure 3:
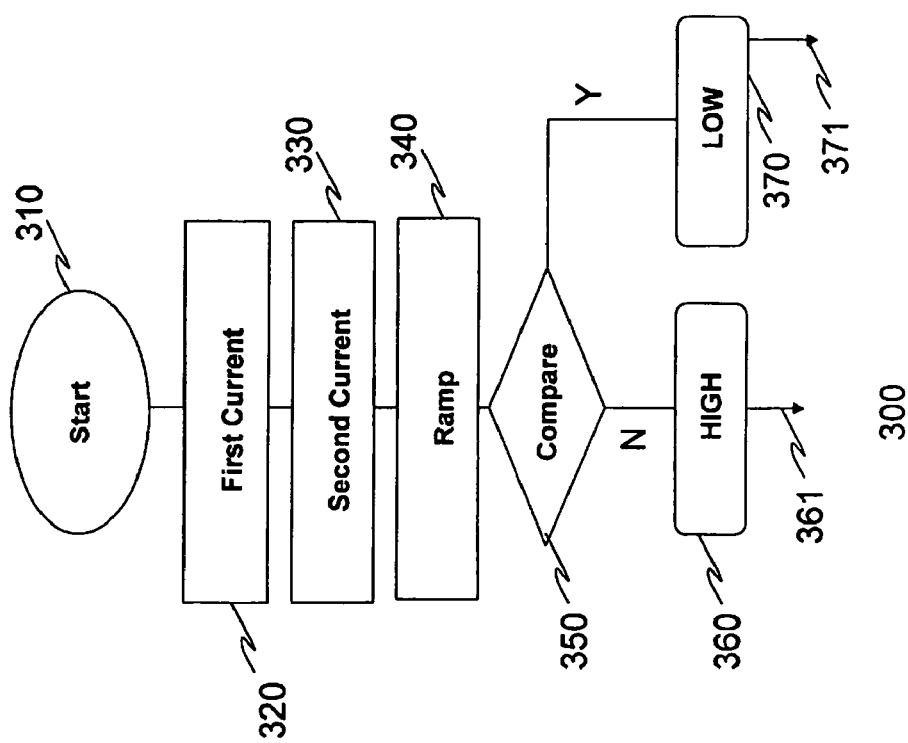
FIG. 3 illustrates one embodiment of the present invention as a method of providing a reliable power on reset (POR) signal with in accordance with a current architecture relating characteristics of typical POR attributes that also permits voltage threshold

FIG. 3 illustrates one embodiment of the present invention as a method 300 of providing a reliable power on reset (POR) signal with in accordance with a current architecture relating characteristics of typical POR attributes that also permits voltage threshold.

In FIG. 3, a first current source 320 is generated using components, circuit devices or software in which the first current generated provides a first quadratic current source proportional to the square of the voltage supply, $V_{SUPP}$, such as $(V_{SUPP})^2$. A second current source 330 (logarithmic) is also generated using components, circuit devices or software in which the second current generated provides a second current source preferentially proportional to the logarithmic of the voltage supply, $V_{SUPP}$, such as $Log(V_{SUPP})$ or $Ln(V_{SUPP})$. The first current value and the second current value, in a preferred embodiment, increase in value proportionate to their mathematical relations with the voltage supply during power supply ramping at 340. The first current value and the second current value are then compared with one another at 350 as both currents entering a comparing means, such as transistors or a simple comparator, for example, where as a result of comparing the two current values, a determination of whether a crossing point has been reached in relation to the two current values. The crossing point of the two currents corresponds to a desired power supply voltage value and is further explained below. If the crossing point has not been attained at the point of comparison, a logical HIGH results at 360 with respect to an output POR signal at 361. If the crossing point has been attained at the point of comparison, a logical LOW results at 370 with respect to an output POR signal at 371.

In operation, both the first current source and the second current source will increase in value in relation to their mathematical formula. At one particular supply voltage, there will be a value that has an equivalence between the two sources, where this point in time is defined as the "crossing point." At this supply voltage, the second current source is greater than the first current source, thereby causing a comparator output voltage VOUT to be or indicate HIGH, such as that as 361. Subsequent to the crossing point the first current source is greater than the second current source, thereby a comparator output voltage VOUT to be or indicate LOW, such as that at 371. In effect, the determination of the crossing point of the two currents corresponds to a desired power supply voltage value (i.e., $V_{SUPPLY}$), such that the POR circuit provides a reset signal and also is able to function as a voltage supply monitor. For example, during initial start-up, when $V_{SUPP}$ is low and has not undergone ramping, the value of Log or natural log of $V_{SUPP}$ will be greater than the value of the quadratic (or square) of $V_{SUPP}$, thereby resulting in a POR rest signal having a logical HIGH value.

In a preferred embodiment, the first current is a quadratic current versus power supply voltage and the second current is an logarithmic current versus power supply voltage.

In a further preferred embodiment, the present invention is a method for generating a POR signal using power supply voltage monitoring comprising the steps of: providing power from a voltage power supply, generating a first current source from a first current generator in relation to a first mathematical formulation being a quadratic function of said voltage power supply, generating a second current source from a second current generator in relation to a second mathematical formulation being a logarithmic function of said voltage power supply, ramping said voltage power supply, comparing said first current source with said second current source at a predetermined period of time, and generating a logical signal as an output POR signal in relation to said comparing step.

FIG. 4A depicts a graphical representation of a logarithmic current 410 in accordance with an embodiment of the present invention. FIG. 4B depicts a graphical representation of a quadratic current 420 in accordance with an embodiment of the present invention.

Figure 5:
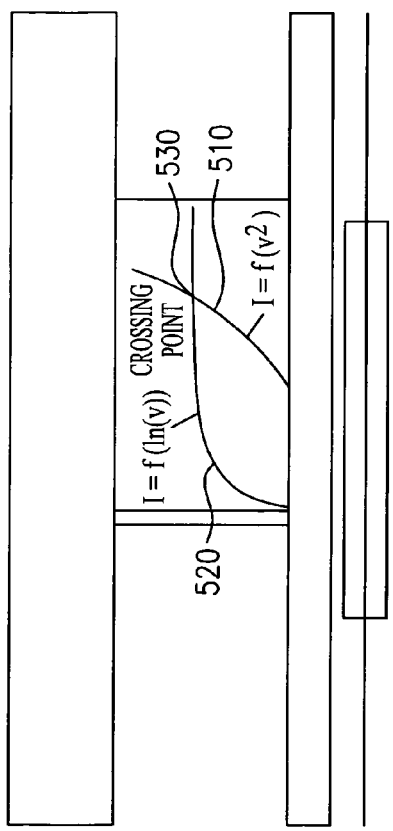
FIG. 5 depicts a graphical representation of a crossing point of a logarithmic current of and a quadratic current in accordance with an embodiment of the present invention.

FIG. 5 depicts a graphical representation of a crossing point at 530 of a logarithmic current 520 and a quadratic current 510 in accordance with an embodiment of the present invention.

Figure 6:
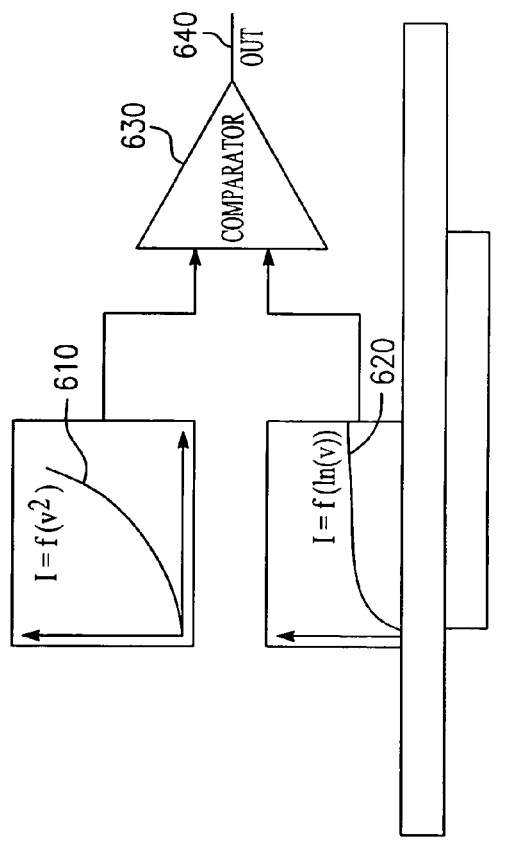
FIG. 6 depicts a general comparison schematic of providing a POR signal by comparing a logarithmic current source and a quadratic current source in accordance with an embodiment of the present invention.

FIG. 6 depicts a general comparison schematic of providing a POR signal at 640 by comparing at 630 a quadratic current source 610 and a logarithmic current source 620 in accordance with an embodiment of the present invention.

Figure 7:
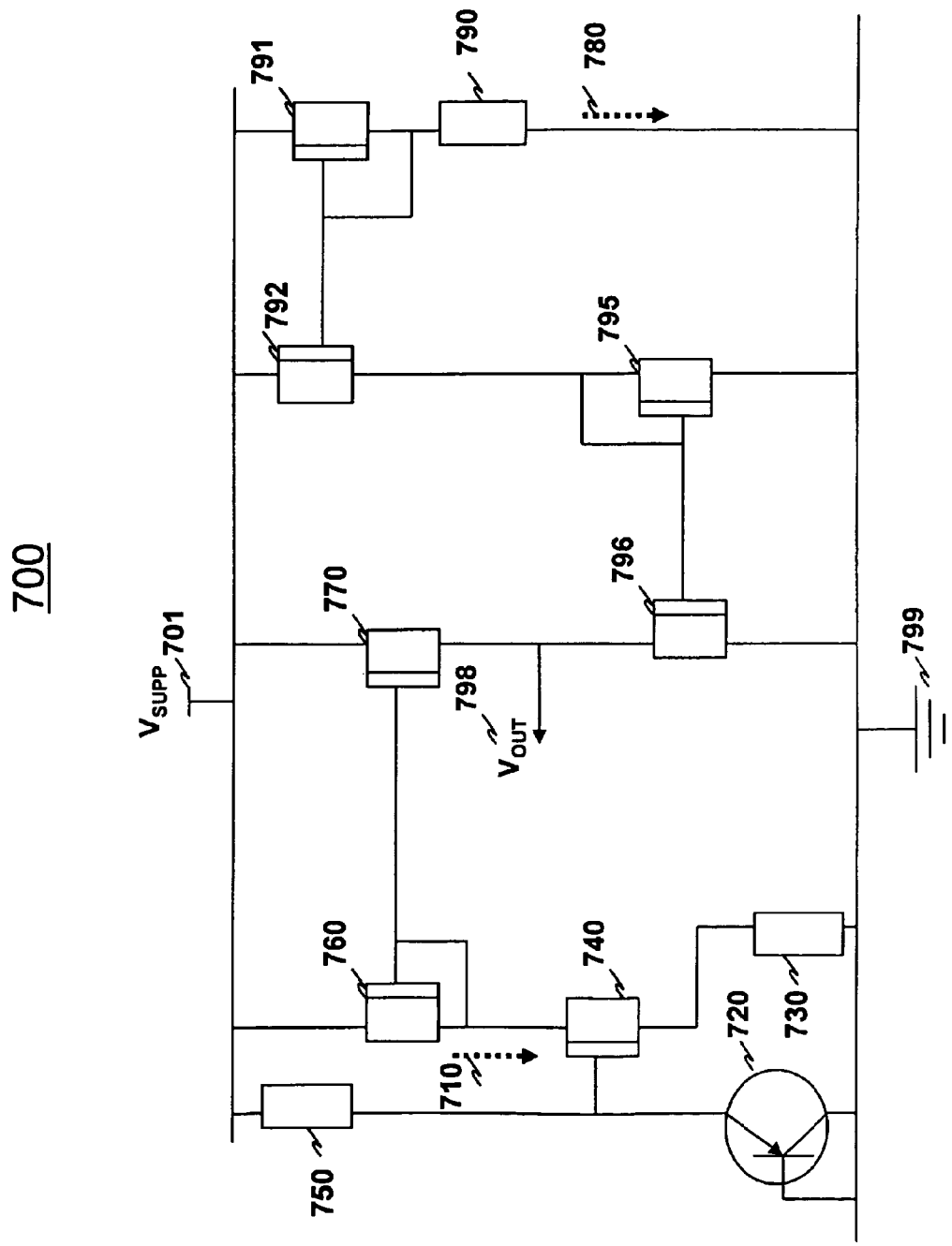
FIG. 7 depicts a schematic of a circuit in accordance with an embodiment of the present invention.

Another preferred embodiment of the present invention provides a circuit for providing a reliable power on reset (POR) signal (i.e., $POR_{SIG}$) using a current architecture comparing a first primary current with a second current in relation to power supply voltage. FIG. 7 depicts a schematic of a circuit 700 in accordance with an embodiment of the present invention.

In FIG. 7, a first current source 710 is generated by a vertical pnp device 720 which base emitter voltage applies to a resistor 730 by the native nmos transistor 740. The base emitter voltage is a logarithmic function of the pnp 720 emitter current and is applied to the resistor 730 which generates the logarithmic current at 710. The native nmos 740 acts as a source follower. The logarithmic current 710 is copied by the two transistors 760 and 770. The current value is determined by the resistor 750. An nmos transistor is an n-channel metal-oxide semiconductor (nmos) transistor is one in which n-type dopants are used in the gate region (the "channel"). Typically, and as used herein, a positive voltage on the gate of an nmos transistor turns the device on In FIG. 7, a second current source's 780 current value is determined by the resistor 790. The current is a function of the quadratic function of the voltage supply and is first copied by means of the two transistors 791 and 792. The current is then copied a second time by transistors 795 and 796.

In FIG. 7, the first current value is then compared with the second current value by a comparing means such as transistors 770 and 796 or a simple comparator means, where as a result of comparing the two current values, voltage at $V_{OUT}$ at 798 is either logically HIGH or LOW and is switched in accordance with the crossing point of the two currents (where the crossing point of the two currents corresponds to a desired power supply voltage).

For instance, during ramping from the power supply, where $V_{SUPP}$ is at 701 and circuit grounding is at 799, both the first and the second current rise with respect to their mathematical courses. By example, one current source having a logarithmic characteristic will ramp over time in accordance with the current value being equal to that as a function of the log or natural log of the $V_{SUPP}$ (i.e., $Log(V_{SUPP})$). Similarly, another current source having a quadratic characteristic will ramp over time in accordance with the current value being equal to that of $(V_{SUPP})^2$.

In operation, both the first current source and the second current source will increase in value in relation to their mathematical formula. At one particular supply voltage, there will be a value that has an equivalence between the two sources, where this supply voltage is defined as the "crossing point." Prior to the crossing point, the first current source is greater (i.e., logarithmic) than the second current source (i.e., quadratic), thereby causing a comparator output voltage $V_{OUT}$ at 798 to be or indicate HIGH. Subsequent to the crossing point the second current source is greater than the first current source, thereby a comparator output voltage $V_{OUT}$ at 798 to be or indicate LOW. In effect, the determination of the crossing point of the two currents corresponds to a desired power supply voltage value (i.e., $V_{SUPPLY}$), such that the POR circuit provides a reset signal and also is able to function as a voltage supply monitor.

In a preferred embodiment, a POR circuit that provides a POR signal and is operable as a voltage supply monitor is provided. The circuit includes a voltage supply terminal receiving a voltage power supply, a first current generator providing a first current source in relation to a first mathematical formulation being a logarithmic function of said voltage power supply, a second current generator providing a second current source in relation to a second mathematical formulation being a function of said voltage power supply, a current comparator for comparing said first current source with said second current source at a predetermined supply voltage, and a POR signal generator for generating a logical signal as output in relation to said current comparator.

In another preferred embodiment of the present invention means for comparing the two current values may include a logic means, comparator devices, software scripts, and other similar component or component devices capable of measuring and comparing voltage or current values.

In a further preferred embodiment, an inverter buffers the $V_{OUT}$ or POR signal logic.

In a further preferred embodiment of the present invention, a computing device having a POR circuit for providing a POR signal and operable as a voltage supply monitor is provided. The computing device includes: a voltage supply terminal receiving a voltage power supply, a first current generator providing a first current source in relation to a first mathematical formulation being a logarithmic function of said voltage power supply, a second current generator providing a second current source in relation to a mathematical formulation of said voltage power supply, a current comparator for comparing said first current source with said second current source at a predetermined period of time, and for generating a logical signal as output, wherein, a crossing point is determined where said first current source crosses said second current source and said logical signal is generated in relation to power supply voltage in relation to said crossing point.

An apparatus having a circuit capable of providing a reliable POR signal with in accordance with a current architecture relating characteristics of typical POR attributes that also permits voltage threshold monitoring is further disclosed. An apparatus may include any electronic device having an integrated chip, chipset, software means or the like, or any electronic device in which switching integrity in relation to voltage supply values and signals occurs.

Many other embodiments of the present invention are also envisioned. For example, in other embodiments, the present invention is directly applicable for integrated circuits, subsystem components and circuitry, power related devices, software process and programmable chip technology.

As used herein for the purposes of the present invention, the term "comparator" may also include amplification functionality, such as that of a differential amplifier, and may also be functionally deployed via a software means, firmware or program circuitry.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow.

In reading the claims it is intended that when words such as "a," "an," "at least one," "at least a portion" are used there is no intention to limit the claim to only one item unless specifically stated to the contrary in the claim. Further, when the language "at least a portion" and/or "a portion" is used the item may include a portion and/or the entire item unless specifically stated to the contrary. While the invention has been illustrated and described in detail in the drawings and foregoing description, the same is to be considered as illustrative and not restrictive in character, it being understood that only the selected embodiments have been shown and described and that all changes, modifications and equivalents that come within the spirit of the invention as defined herein or by any of the following claims are desired to be protected.

What is claimed is:

1. A circuit comprising:
 a voltage supply terminal for receiving a voltage power supply;
 a first current generator for providing a first current in relation to a first mathematical formulation being a quadratic function of said voltage power supply, wherein said first current generator includes a vertical pnp device;
 a second current generator for providing a second current in relation to a second mathematical formulation being a logarithmic function of said voltage power supply;
 a current comparator for comparing values of said first current with said second current;
 a signal generator for generating a signal in relation to said current comparator; and
 a circuit portion to generate a third current and a fourth current, wherein the first current is a copy of the third current and the second current is a copy of the fourth current.

2. A circuit comprising:
 a voltage supply terminal for receiving a voltage power supply;
 a first current generator for providing a first current in relation to a first mathematical formulation being a quadratic function of said voltage power supply;
 a second current generator for providing a second current in relation to a second mathematical formulation being a logarithmic function of said voltage power supply;
 a current comparator for comparing values of said first current with said second current;
 a signal generator for generating a signal in relation to said current comparator;
 a buffer for buffering said signal generated by said signal generator, wherein said buffer includes an inverter and said signal generator is configured to generate a full chip reset signal; and
 a circuit portion to generate a third current and a fourth current, wherein the first current is a copy of the third current and the second current is a copy of the fourth current.

3. The integrated circuit of claim 2 wherein said signal generator is configured to provide power supply voltage monitoring in relation to the signal generated by the signal generator.

4. The device of claim 2 wherein said quadratic function is square of said voltage power supply, said logarithmic function is $Log(V_{SUPP})$ or $Ln(V_{SUPP})$, and said current comparator is configured to compare said first and second currents in relation to a power supply voltage value.

5. The device of claim 4, wherein said power supply voltage value is provided at a period of time during start up of said device.

6. A circuit comprising:
 a voltage supply terminal for receiving a voltage power supply;
 a first current generator for providing a first current in relation to a first mathematical formulation being a quadratic function of said voltage power supply;
 a second current generator for providing a second current in relation to a second mathematical formulation being a logarithmic function of said voltage power supply;
 a current comparator for comparing values of said first current with said second current;
 a signal generator for generating a signal in relation to said current comparator; and
 a circuit portion to generate a third current and a fourth current, wherein the first current is a copy of the third current and the second current is a copy of the fourth current.

7. The circuit of claim 6 wherein said quadratic function is square of said voltage power supply.

8. The circuit of claim 6 wherein said logarithmic function is $Log(V_{SUPP})$ or $Ln(V_{SUPP})$.

9. The circuit of claim 8 wherein said quadratic function is square of said voltage power supply, and said current comparator is configured to compare values of said first and second currents in relation to a power supply voltage value.

10. The circuit of claim 9 wherein said power supply voltage value is determined when a value of the first current is equal to a value of the second current.

11. The circuit of claim 10 wherein said signal corresponds to a first logical value when the value of the first current is less than the value of the second current.

12. The circuit of claim 11 wherein said signal said crossing point has corresponds to a second logical value when the value of the first current is greater than the value of the second current.

13. A method comprising:

providing power from a voltage power supply;

generating a first current from a first current generator in relation to a first mathematical formulation being a quadratic function of said voltage power supply;

generating a second current from a second current generator in relation to a second mathematical formulation being a logarithmic function of said voltage power supply;

ramping said voltage power supply;

comparing said first current with said second current;

generating a signal as an output signal in relation to said comparing generating a third current and a fourth current;

copying the third current to generate the first current; and copying the fourth current to generate the second current.

14. The method of claim 13, wherein said quadratic function is square of said voltage power supply, $(V_{SUPP})^2$.

15. The method of claim 14, wherein said logarithmic function is a direct function of the logarithmic of said voltage power supply, $Log(V_{SUPP})$ or $Ln(V_{SUPP})$.

16. The method of claim 13, wherein said logarithmic function is a direct function of the logarithmic of said voltage power supply, $Log(V_{SUPP})$ or $Ln(V_{SUPP})$.

17. The method of claim 13, wherein said ramping causes a value of said first current to be greater than a value of said second current.

18. The method of claim 17, wherein said signal generated as the output corresponds to a first logical value.

19. The method of claim 13, wherein said ramping causes a value of said first current to be less than a value of said second current.

20. The method of claim 19, wherein said signal generated as the output corresponds to a second logical value.

21. The method of claim 13, wherein said ramping causes a value of said first current to be equal to a value of said second current at.

* * * * *